US006168973B1

United States Patent
Hubbard

(10) Patent No.: US 6,168,973 B1
(45) Date of Patent: Jan. 2, 2001

(54) SEMICONDUCTOR STACKED DEVICE FOR IMPLANTABLE MEDICAL APPARATUS AND METHOD FOR MAKING SAME

(75) Inventor: Robert L. Hubbard, Tempe, AZ (US)

(73) Assignee: Medtronic, Inc., Minneapolis, MN (US)

(*) Notice: Under 35 U.S.C. 154(b), the term of this patent shall be extended for 0 days.

(21) Appl. No.: 09/292,423

(22) Filed: Apr. 15, 1999

Related U.S. Application Data

(62) Division of application No. 09/143,141, filed on Aug. 28, 1998, now Pat. No. 6,051,887.
(51) Int. Cl.[7] .......................... H01L 21/44; H01L 21/48; H01L 21/50
(52) U.S. Cl. .......................... 438/109; 438/612; 438/613
(58) Field of Search .................................. 438/109, 612, 438/613

(56) References Cited

U.S. PATENT DOCUMENTS 5,198,888  3/1993  Sugano .
5,514,907  5/1996  Moshayedi .

*Primary Examiner*—John F. Niebling
*Assistant Examiner*—David A. Zarneke
(74) *Attorney, Agent, or Firm*—Thomas F. Woods; Harold R. Patton; Girma Wolde-Michael

(57) ABSTRACT

A stacked semiconductor device is formed with a first mounting substrate, e.g., a single metal layer die tape, having a first semiconductor die attached thereto and a second mounting substrate, e.g., a double metal layer die tape having a second semiconductor die attached thereto. Substantially columnar solder connections, each formed from two solder balls are used to stack the first mounting substrate and the second mounting substrate such that the second semiconductor die is positioned between the mounting substrates. For example, identical memory dice may be stacked in this manner or different types of die such as a processor die and a memory die may be stacked in this manner for use in implantable medical apparatus.

23 Claims, 13 Drawing Sheets

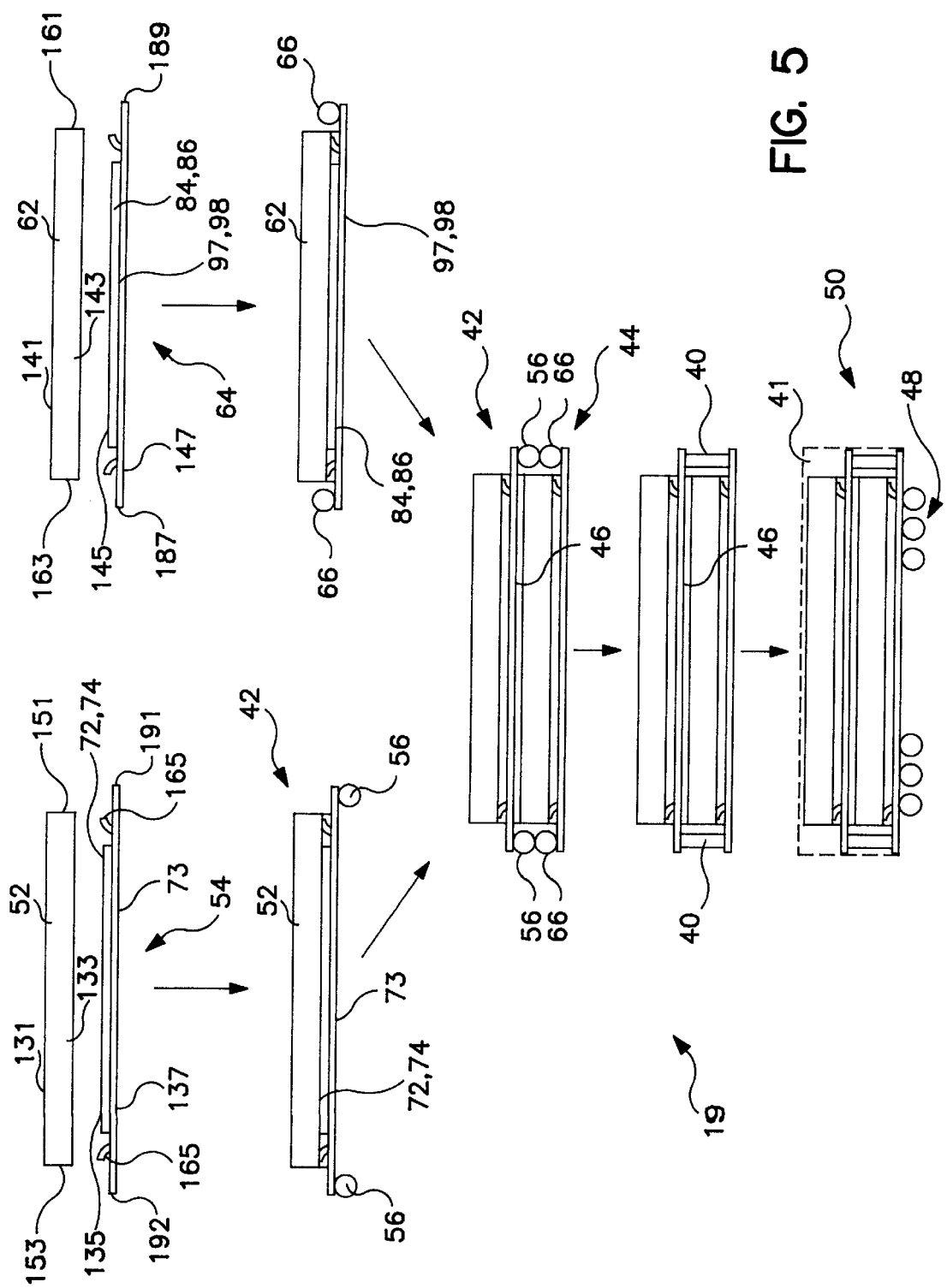

SEMICONDUCTOR STACKED DEVICE FOR IMPLANTABLE MEDICAL APPARATUS AND METHOD FOR MAKING SAME

This application is a divisional application of U.S. patent application Ser. No. 09/143,141 filed Aug. 28, 1998 U.S. Pat. No. 6,051,887 entitled "Semiconductor Stacked Device for Implantable Medical Apparatus" to Hubbard.

FIELD OF THE INVENTION

The present invention relates to semiconductor die level packaging. More particularly, the present invention relates to the stacking of semiconductor dice in the packaging of components, e.g., memory devices such as for use in implantable medical devices.

BACKGROUND OF THE INVENTION

The development of manufacturing electronic products is continually being challenged by a growing market demand for smaller, more efficient, and a higher performance product. The current trend towards miniaturization is driven to a large extent by portable electronic product applications. However, other product categories are under pressure to reduce sizes, as well, such as in the medical device industry where size is also important. For example, implantable medical devices such as pacemakers require smaller components yet are being required to provide higher performance than previous product. For example, more memory must occupy smaller space. There are numerous packaging techniques that have been used in the past. For example, some of such techniques include dual in-line packaging (DIP), leadless chip carrier processing, leaded molded plastic packaging, surface mount processing, etc. In addition, more recently, chip scale packaging (CSP) has been introduced. Generally, CSP includes the packaging of integrated circuits in packages which are substantially the same size or slightly larger than the integrated circuit die being packaged.

Various techniques have been developed for increasing integrated circuit die density on a printed circuit board or other type of circuit assembly, i.e., density of die on a longitudinal plane such as a plane defining a printed circuit board. For example, as described above, the smaller the component package of a semiconductor die (e.g., CSP), the greater the density of semiconductor die on such a longitudinal plane defining the circuit board. In other words, the number of die packages which can be mounted on the circuit board is increased.

Further, for example, vertical stacking (i.e., vertical relative to the horizontal plane) of dice or packaged dice has also been described for increasing chip density on printed circuit boards. For example, it is known to use connector structures for connecting a plurality of automated bonding tapes each having a respective semiconductor die attached thereto. Such connectors are used to stack the semiconductor dice attached to the die tape and provide electrical connection of each die being stacked to the printed circuit board. However, such connectors are separately constructed components adding to the overall cost and complexity of the stacked device. In addition, such connectors may use additional space leading to a decrease in die density on the circuit board. Packaged surface mount components have also been vertically stacked using separately constructed connection elements for providing vertical stacking of the packages and electrical connection of the individual packages of the stack to the printed circuit board upon which the stacked device is to be mounted.

Further, as described in an article from Tessera, Inc. entitled "Tessera Application Notes—Application Note 001—Stacked chips for high density memory module applications," (August 1995), microball grid array technology available under the trade designation of ($\mu$BGA) can be used for chip stacking. As described in this article, a stack of four packaged memory chips is created by fanning leads outward away from the die in lead frame fashion. The lead frame-like flex or rigid carrier of each of the die is interconnected by a stack of single solid core solder balls. Such stacking of the packaged chips uses membranes between the stacked packaged chips, such as Tessera Compliant Mounting Tape (TCMT) available from Tessera, Inc., which extend past the edge of the packaged chip such that the stack of solder balls can interconnect the stacked memories in a bus structure.

The Tessera approach using a single stack of solder balls for interconnection of the memory chips, requires backlapped die for matching thicknesses within the stacked packaged component device. For example, the die must be backlapped such that the solder balls used extend from one of the membranes between the stacked packaged chips to the next membrane for interconnection therebetween. However, a backlapping process may produce unusable die. In other words, the yield from a wafer of suitable die produced using a backlapping process is generally less than when no backlapping process is used.

The stacking techniques described above suffer from one or more of a number of problems. For instance, many of the techniques require the manufacture of custom dice that are specifically designed or backlapped for stacking, or many of such techniques involve the use of separately constructed connection elements. Further, many of such techniques for stacking dice are not useable in mass production techniques and/or are not cost effective to produce.

For example, in particular, with respect to memory devices used in medical apparatus, many of the above techniques can be used to stack memory die for increasing density but they are not cost effective or easily mass producible. In the case of implantable medical devices, medical personnel desire as much memory as possible in such devices without increasing the device size. By vertically stacking memory die, memory size can be increased by only taking up vertical height. In other words, semiconductor die density on a circuit board of the implanted medical device is substantially increased by vertical stacking without use of precious circuit board area along the horizontal plane defining the circuit board or assembly upon which the device is mounted.

Table 1 below lists U.S. patents that describe a couple of stacking techniques:

TABLE 1

| U.S. Pat. No. | Inventor(s) | Issue Date |
|---|---|---|
| 5,198,888 | Sugano, et al. | 30 March 1993 |
| 5,514,907 | Moshayedi | 7 May 1996 |

All patents listed in Table 1, and elsewhere herein, are incorporated by reference in their respective entirety. As those of ordinary skill in the art will appreciate readily upon reading the Summary of the Invention, Detailed Description of the Embodiments, and claims set forth below, many of the devices and methods disclosed in the patents of Table 1 may be modified advantageously by using the teachings of the present invention. However, the listing of any such patents in Table 1 is by no means an indication that such patents are prior art to the present invention.

SUMMARY OF THE INVENTION

The present invention has certain objects. That is, various embodiments of the present invention provide solutions to one or more problems existing in the prior art with respect to the stacking of semiconductor die, particularly for use in implantable medical devices. One of such problems involves the inability to increase die density on a circuit board while simultaneously enhancing the mass producibility of stacked semiconductor die in a cost effective manner. Further, other problems include: use of separately constructed connection elements for the stacking of packaged dice and/or unpackaged dice; the excessive cost associated with custom die and/or die package configurations formed so that they may be stacked; overall cost associated with the number of non-standard components or elements used in constructing the stacked devices; the decrease in yield due to backlapping of die; and the inability to maintain a low profile and take advantage of CSP.

In comparison to known techniques for stacking semiconductor devices, various embodiments of the present invention may provide one or more of the following advantages. For example, there may be no need for backlapping the semiconductor die prior to stacking of such die. Further, for example, no non-standard connection elements are generally required as solder balls generally available are used as the manner of connecting the various stacked elements. Yet further, a small chip scale package having a relatively low profile can be achieved and the semiconductor stacked device of the present invention can be easily surface mountable to a printed circuit board. The stacked semiconductor device can be easily mass producible, is cost effective, and the semiconductor dice being stacked self-align to one another. Yet further, any number of different semiconductor die may be stacked according to the present invention assuming such dice have compatible interconnection density. In addition, die density relative to a horizontal plane defining a printed circuit board is substantially increased by the vertical stacking of the dice and the ability to achieve chip scale packaging for the stacked dice.

Some embodiments of the present invention include one or more of the following features: an implantable medical apparatus having at least one semiconductor stacked device according to the present invention therein, e.g., a stacked memory device; a first and second mounting substrate each having a semiconductor die associated therewith stacked using a plurality of substantially columnar solder connections; mounting substrates for the first and second semiconductor die including a first mounting substrate which has conductive traces for electrical connection to die bond pads of a first semiconductor die and a second mounting substrate which includes conductive vias therethrough, conductive traces extending from such conductive vias on one side of the second mounting substrate for electrical connection to the traces of the first mounting substrate, and conductive traces on the other side of the mounting substrate for electrical connection to die bond pads of the second semiconductor die; conductive pad regions on one side of a first mounting substrate proximate at least two opposing edges of the first mounting substrate and corresponding conductive pad regions on one side of the second mounting substrate proximate at least two opposing edges of the second mounting substrate; corresponding conductive pad regions proximate more than two opposing edges of the mounting substrates; staggered corresponding conductive pad regions proximate two or more edges of the mounting substrates; solder ball columns formed from two solder balls to electrically connect the mounting substrates and stack the dice; the semiconductor dice of the stacked device being memory dice; using a single metal layer die tape having the first semiconductor die attached thereto and a double metal layer die tape having a second semiconductor die attached thereto to form the stacked the semiconductor device; using solder balls to stack the single metal layer die tape and the double metal layer die tape such that a semiconductor die is positioned between the single metal layer die tape and the double metal layer die tape; a plurality of substantially columnar solder connections, each formed from two solder balls to connect a single metal layer die tape and the double metal layer die tape; a stacked memory device including two identical memory dice stacked using solder balls; and a stacked device including two different types of die and of different sizes, e.g., a microprocessor die and a memory die.

BRIEF DESCRIPTION OF THE DRAWINGS

FIG. 5 is a flow diagram illustrating the assembly of the semiconductor stacked device shown in FIG. 3 according to the present invention.

DETAILED DESCRIPTION OF THE EMBODIMENTS

In accordance with the present invention, semiconductor stacked devices are formed which may be useable in a variety of applications. For example, the semiconductor stacked devices formed herein may be used in any electronic apparatus. The present invention is particularly beneficial for use in implantable medical devices.

Figure 1:
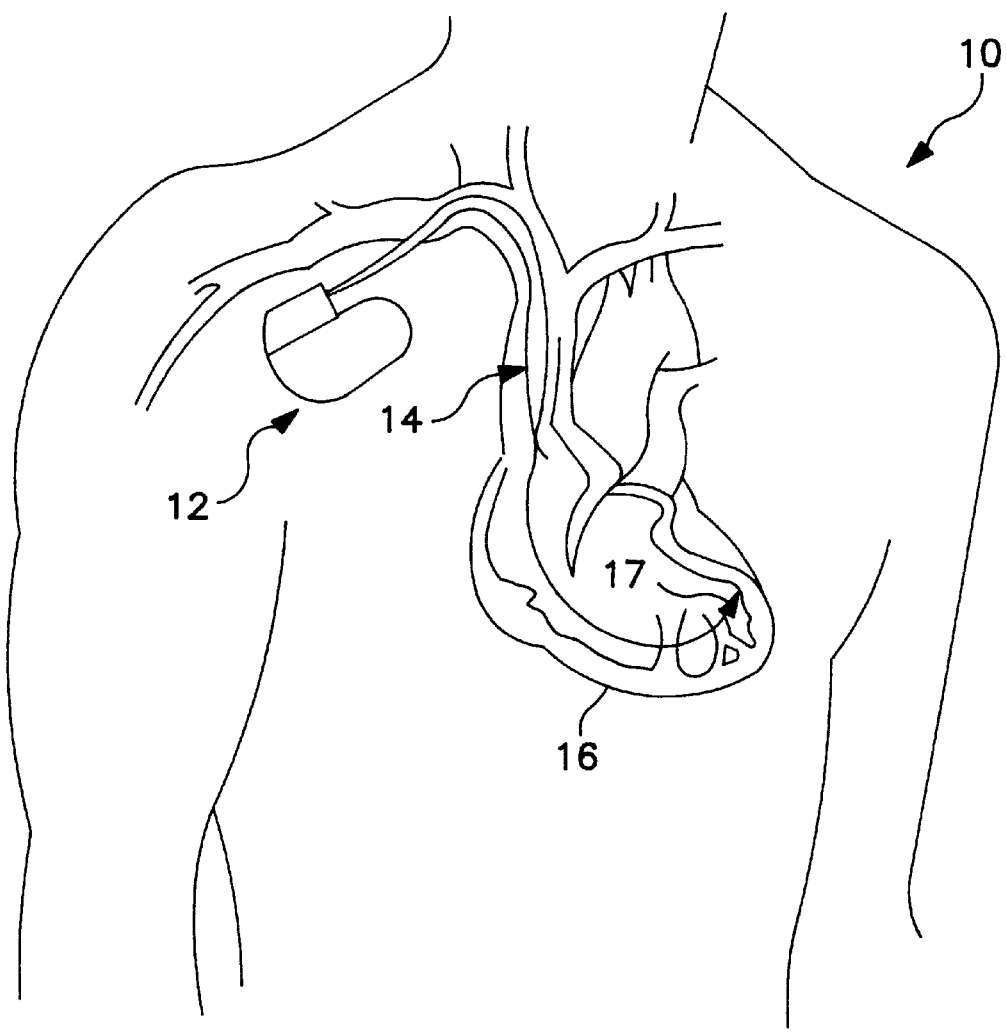
FIG. 1 is a diagram illustrating an implantable medical device in a body; the medical device including a semiconductor stacked device according to the present invention.

FIG. 1 is a simplified schematic view of an implantable medical device 12 embodying the present invention, wherein the implantable medical device 12 includes at least one semiconductor stacked device according to the present invention. At least one lead 14 is connected to the implantable medical device 12 which is implanted near human heart 16. In the case where implanted medical device 12 is a pacemaker implanted in body 10, the pacemaker 12 includes at least one or both of pacing and sensing leads represented generally as leads 14 to sense electrical signals attendant to the depolarization and repolarization of the heart 16, and provide pacing pulses for causing depolarization of cardiac tissue in the vicinity of the distal ends 17 thereof. For example, implantable medical device 12 may be an implantable cardiac pacemaker such as that described in U.S. Pat. No. 5,158,078 to Bennett et al., U.S. Pat. No. 5,312,453 to Shelton et al., or U.S. Pat. No. 5,144,949 to Olson et al., hereby incorporated herein by reference in their respective entireties.

Implantable medical device 12 may also be a pacemaker-cardioverter-defibrillator (PCD) corresponding to any of the various commercially available implantable PCDs. The present invention may be practiced in conjunction with PCDs such as those described in U.S. Pat. No. 5,545,186 to Olson et al., U.S. Pat. No. 5,354,316 to Keimel, U.S. Pat. No. 5,314,430 to Bardy, U.S. Pat. No. 5,131,388 to Pless, or U.S. Pat. No. 4,821,723 to Baker et al., all hereby incorporated herein by reference in their respective entireties.

Alternatively, implantable medical device 12 may be an implantable nerve stimulator or muscle stimulator such as that disclosed in U.S. Pat. No. 5,199,428 to Obel et al., U.S. Pat. No. 5,207,218 to Carpentier et al., or U.S. Pat. No. 5,330,507 to Schwartz, or an implantable monitoring device such as that disclosed in U.S. Pat. No. 5,331,966 issued to Bennett et al., all of which are hereby incorporated by reference herein in their respective entireties. Therefore, the present invention is believed to find wide application in any form of implantable electrical device.

Although the present invention is particularly described with reference to use in implantable medical devices, the present invention is in no manner limited to such applications. For example, the present invention may be used in any electronic application where a semiconductor stacked device is beneficial to increase die density for such apparatus, or when such a semiconductor stacked device provides some alternate advantageous benefit.

Figure 2:
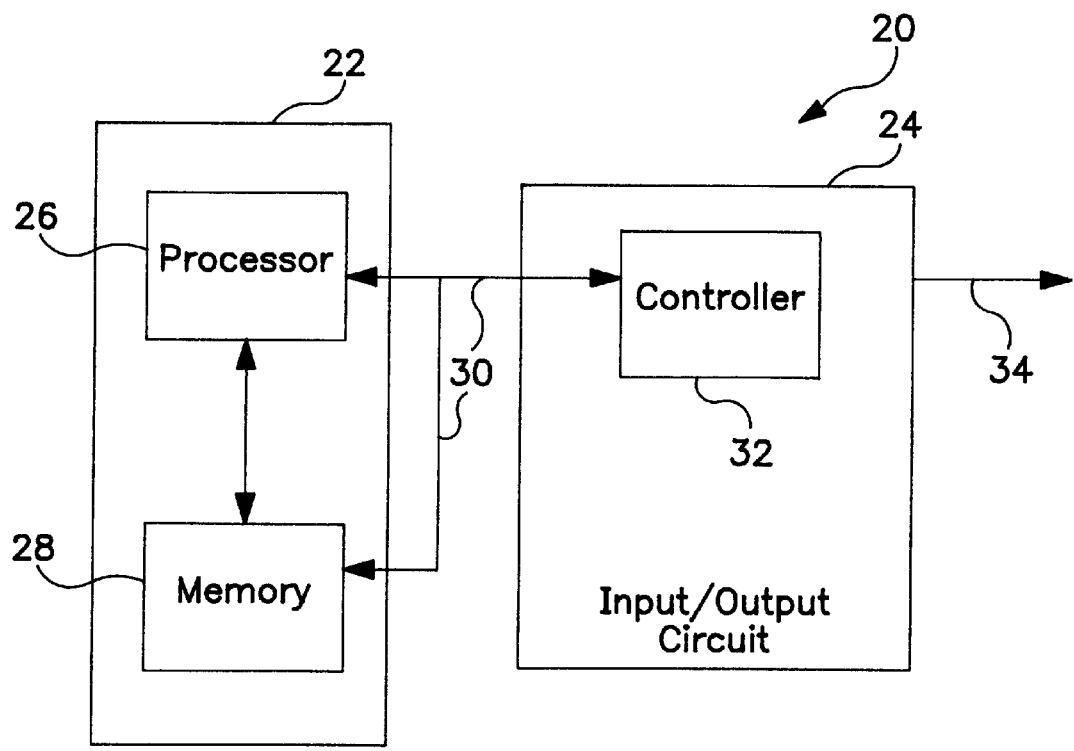
FIG. 2 is a general block diagram of circuitry of an implantable medical device including a stacked device according to the present invention.

FIG. 2 generally illustrates a high level block diagram of constituent components of an implantable medical device according to embodiments of the present invention, where the medical device is implemented with a microprocessor-based architecture. However, the electronic features and operations of the implantable medical device may be implemented in discrete logic or as a microcomputer-based system.

As shown in FIG. 2, the implantable medical device 20 includes a microcomputer circuit 22 including at least a processor 26 and memory 28. The microcomputer circuit 22 is coupled by a data communications bus 30 to a controller circuit 32 of an input/output circuit 24. Microcomputer circuit 22 may form a custom integrated circuit device augmented by standard RAM/ROM components. For example, the semiconductor stacked device according to the present invention may be a stacked microcontroller die and memory die or processor die and memory die. Further, the semiconductor stacked device may be two stacked memory die such as with chip select addressing. The input/output circuit 24 may include any other number of circuits in addition to the controller 32 such as necessary for accomplishing the function of the implantable medical device 20. For example, the input/output circuit 24 may include sense amplifiers, peak sense and threshold measurement units, telemetry circuits, bias circuits, pulse generators, threshold detectors, etc. along with any other input/output circuits such as those required to provide the controller 32 with appropriate signaling information. The specific embodiments of such circuits are not critical to practice of the present invention so long as the circuits provide for generating signals corresponding to the desired implantable medical device and/or are capable of providing controller 32 with signals indicative of applicable physiological events, e.g., natural and stimulated contractions of the heart.

The semiconductor stacked device 38 according to the present invention shall generally be described with reference to FIGS. 3–11. Thereafter, particular configurations for a two memory die stack configuration and for a stack of two different sized dice, e.g., a processor die and a memory die, shall be described with reference to FIGS. 12–14.

Figure 3:
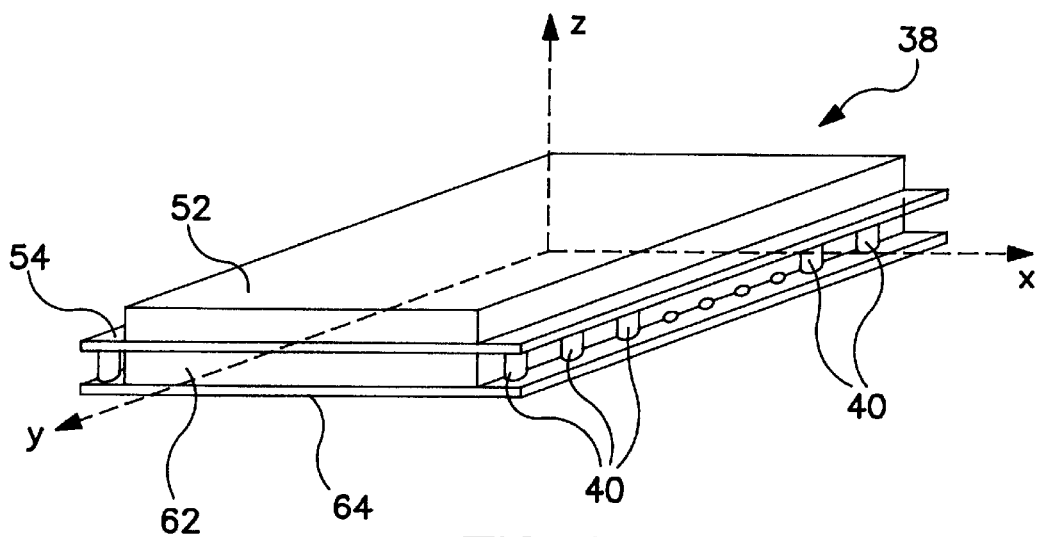
FIG. 3 is a perspective view of an illustrative embodiment of a semiconducor stacked device according to the present invention.

FIG. 3 generally shows a perspective view of a configuration of a semiconductor stacked device 38 according to the present invention in an xyz coordinate system. The semiconductor stacked device 38 includes a first mounting substrate 54, e.g., a single metal die tape used in tape automated bonding (TAB) processes, having a semiconductor die 52 attached thereto. Further, the semiconductor stacked device 38 includes a second mounting substrate 64, e.g., a double metal layer die tape used in TAB processes, having a second semiconductor die 62 attached thereto. The first semiconductor die 52 and second semiconductor die 62 are stacked in the vertical direction (i.e., along the z axis) using substantially columnar solder connections 40. The substantially columnar solder connections 40 as shall be described further with reference to other figures hereof are formed from solder balls attached respectively to both the first mounting substrate 54 and second mounting substrate 64.

Figure 4:
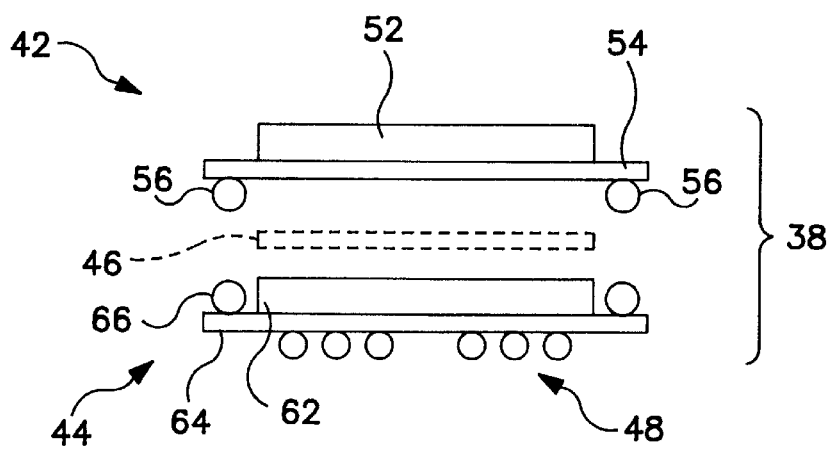
FIG. 4 is an exploded end view of the stacked device of FIG. 3.
Figure 7A:
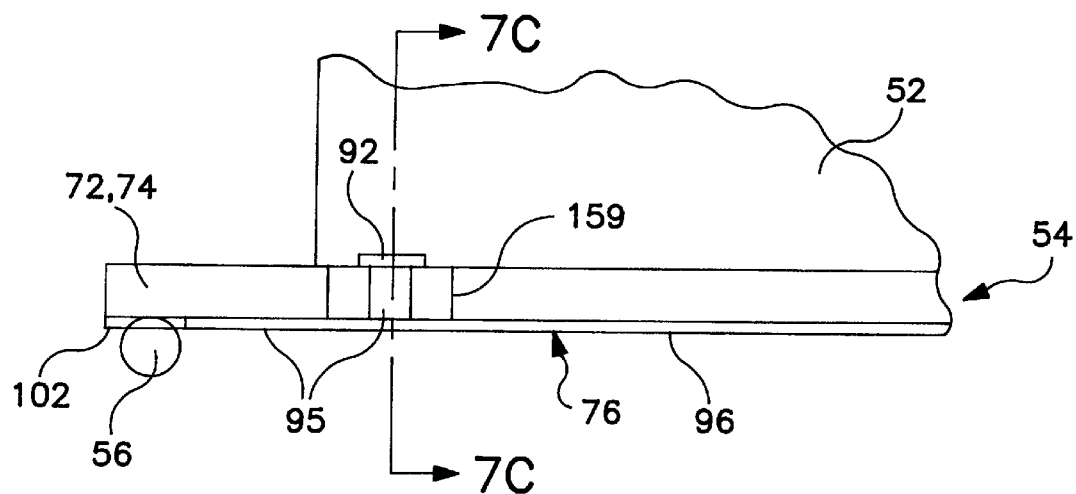
FIGS. 7A, 7B, and 7C are more detailed views of one section of the mounting substrates shown to illustrate the details of the components used for electrical connection of the two mounting substrates and semiconductor dice attached thereto.
Figure 8:
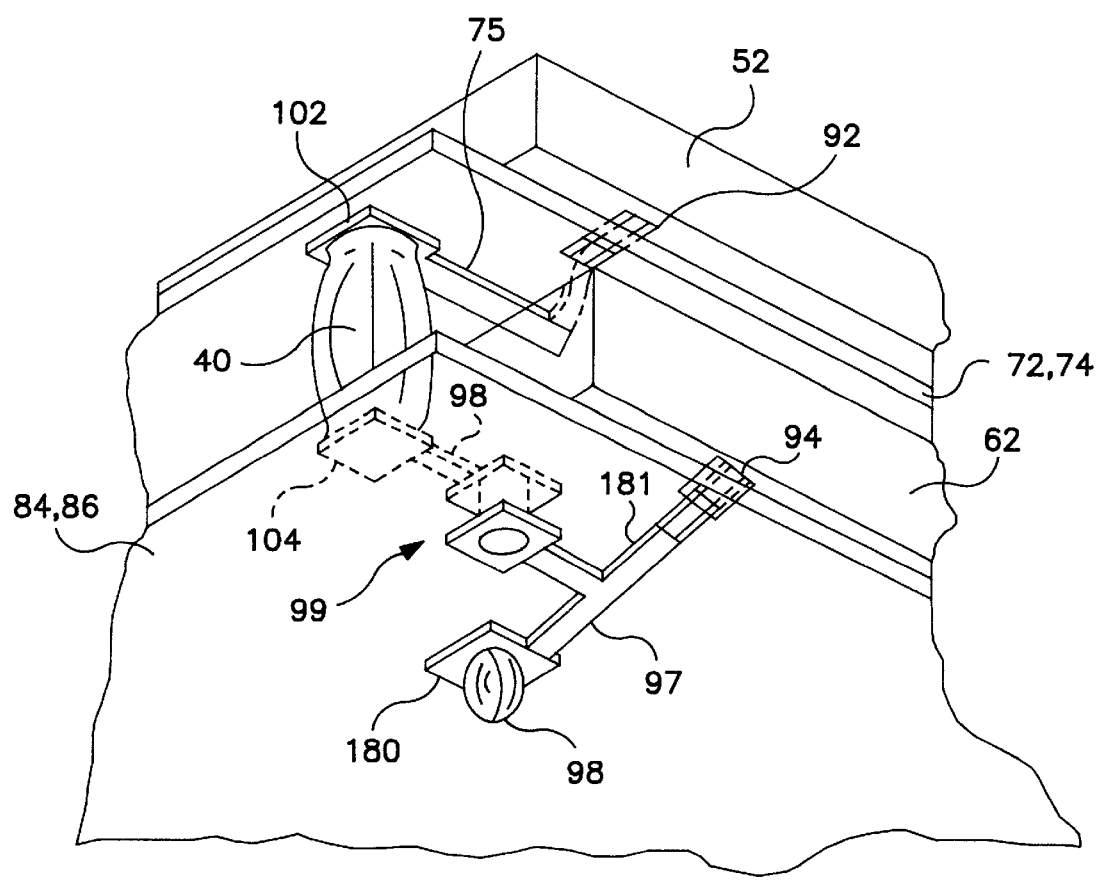
FIG. 8 is a detailed perspective view taken from the bottom of the left front corner of a portion of the semiconductor stacked device of FIG. 3 including the elements as shown in FIGS. 7A and 7B of the mounting substrates.

As shown in FIG. 4, the semiconductor stacked device 38 is generally formed of a first subassembly 42 and a second subassembly 44. The first subassembly 42 includes first mounting substrate 54 having die 52 attached thereto. Further, the first subassembly 42 includes a plurality of solder balls 56 attached to conductive pad regions 102 (FIG. 9A) of the first mounting substrate 54. The conductive pad regions 102 shown in further detail in FIGS. 7A and 8 are a portion of the conductive trace or lead connected to die bond pads 92 on semiconductor die 52. Such die bond pads 92 are also shown in further detail in FIGS. 7A and 8.

Likewise, subassembly 44 includes second mounting substrate 64 having a semiconductor die 62 attached thereto. In addition, the subassembly 44 includes a plurality of solder balls 66 attached to conductive pad regions 104 (FIG. 10A) shown in further detail in FIGS. 7B and 8. The conductive pad regions 104 are part of the conductive traces or leads connected through the second mounting substrate 64 to external conductive pad regions 180 further shown in detail in FIGS. 8 and 10B. Also shown in FIG. 4 is an optional adhesive material 46 positioned between the first mounting substrate 54 and the second semiconductor die 62. With use of an adhesive material 46 between such elements, initial alignment of the elements, adhesion of the elements, and mechanical separation of the elements can be accomplished. The adhesive material 46, for example, may include a material such as commercially available epoxy adhesives.

Further, FIG. 4 shows a plurality of solder balls 48 attached to external conductive pad regions 180 shown in further detail in FIG. 8. The solder balls 48 are used for electrical connection of the semiconductor stacked device 38 to another assembly, such as a printed circuit board, a hybrid circuit, etc. With use of solder balls 48, such as those used in ball grid arrays, a package device can be formed which is easily surface mountable to any of a variety of assemblies. In such a manner, chip scale packaging of these semiconductor stacked devices 38 can be accomplished. In other words, the horizontal planar area (i.e., the xy plane) occupied by the semiconductor stacked device 38 is just slightly larger than the semiconductor die being packaged. Horizontal planar area refers to the area, for example, used on the surface of a printed circuit board when the device is mounted thereon.

With reference to FIG. 5, a method 19 of assembling the semiconductor stacked device 38 according to the present invention shall be generally described. It will be recognized by one skilled in the art that various processes may be used in the method 19 to accomplish the various steps generally described with reference thereto. As such, the illustrative steps described herein are selected for illustrating the use of solder balls to stack dice, but the method 19 is clearly not limited to the use of only such particular illustrative steps. For example, various temperatures for the reflow process described below may be used. The solder balls selected for interconnection of the first mounting substrate and second mounting substrate may be based on a number of considerations including but clearly not limited to the size or thickness of the second semiconductor die 62, a plurality of the stacked devices may be formed simultaneously in an array or strip as would be recognized by one skilled in the art from the description herein, and further, for example, various types of equipment for attaching the various structural elements to one another to form the semiconductor stacked device 38 are available and may be used accordingly.

Figure 9A:
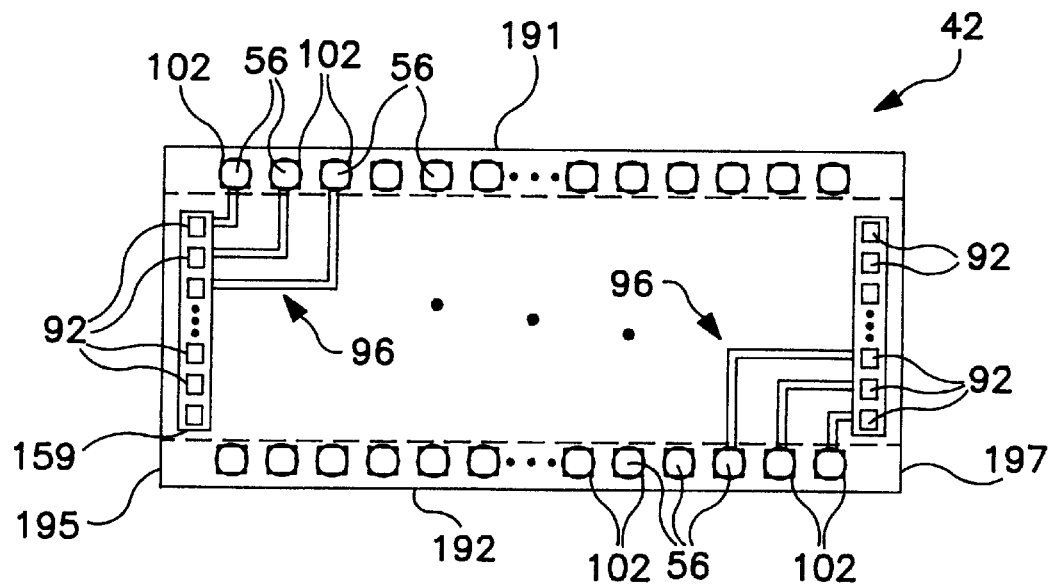
FIGS. 9A and 9B are a bottom view and top view, respectively, of a first subassembly for use in the method as shown in FIG. 5 including a first mounting substrate and semiconductor die attached thereto with solder balls attached at edge locations of the first mounting substrate.
Figure 9B:
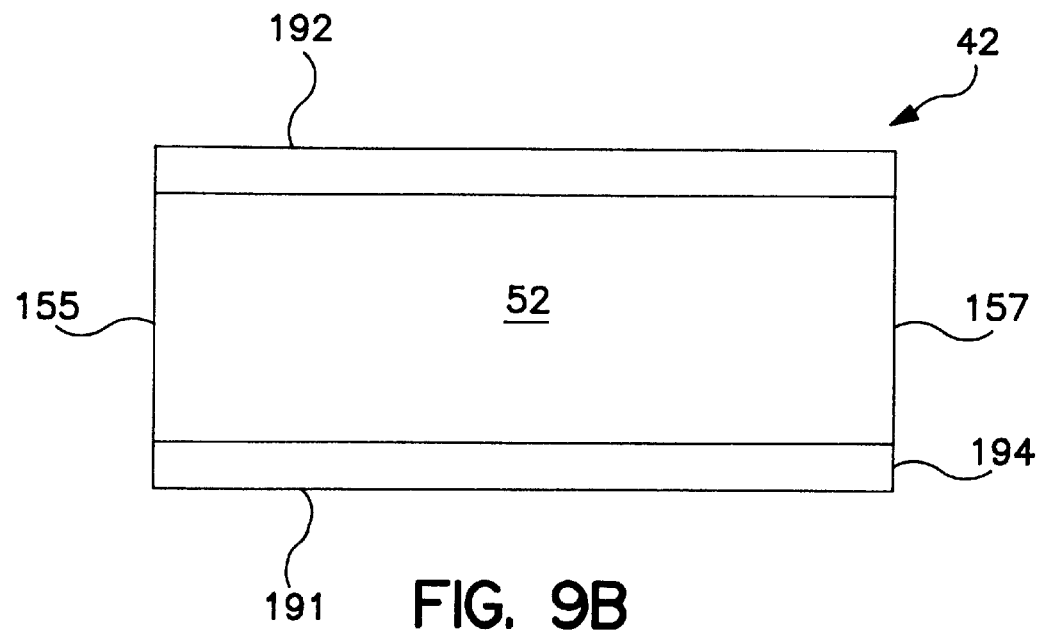

As shown in the beginning of the assembly process 19 of FIG. 5, subassembly 42 and subassembly 44 must first be assembled. With respect to subassembly 42, the assembly process begins with essentially two components: the semiconductor die 52 and the first mounting substrate 54. The first semiconductor die 52 includes an upper side 131 and a lower side 133 as shown in FIG. 5, a first pair of opposing edges 151, 153, and a second pair of opposing edges 155, 157, as shown in FIGS. 9A and 9B. Further, the semiconductor die 52 includes die bond pads 92 for use in electrically connecting the circuits of the die externally to other elements, circuits, etc. Obviously, the die bond pads may take one of various configurations on the semiconductor die. Generally, with respect to some memory dice such die bond pads are located on a primary face of the die along two opposing edges thereof, such as shown in FIG. 9A. With respect to some processor dice, such die bond pads may be located on a primary face of the die along each edge thereof.

Figure 13:
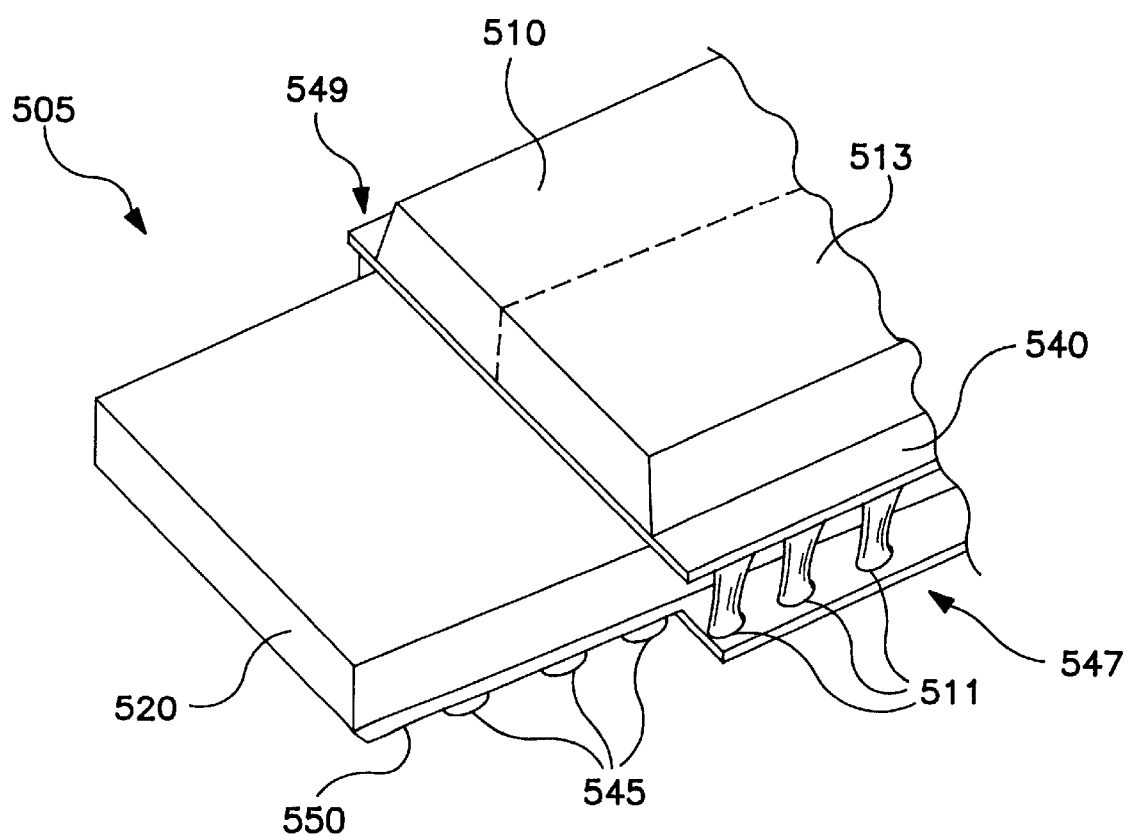
FIG. 13 is a perspective view of another illustrative embodiment of a semiconductor stacked device according to the present invention showing the stacking of two die of unequal size.
Figure 14:
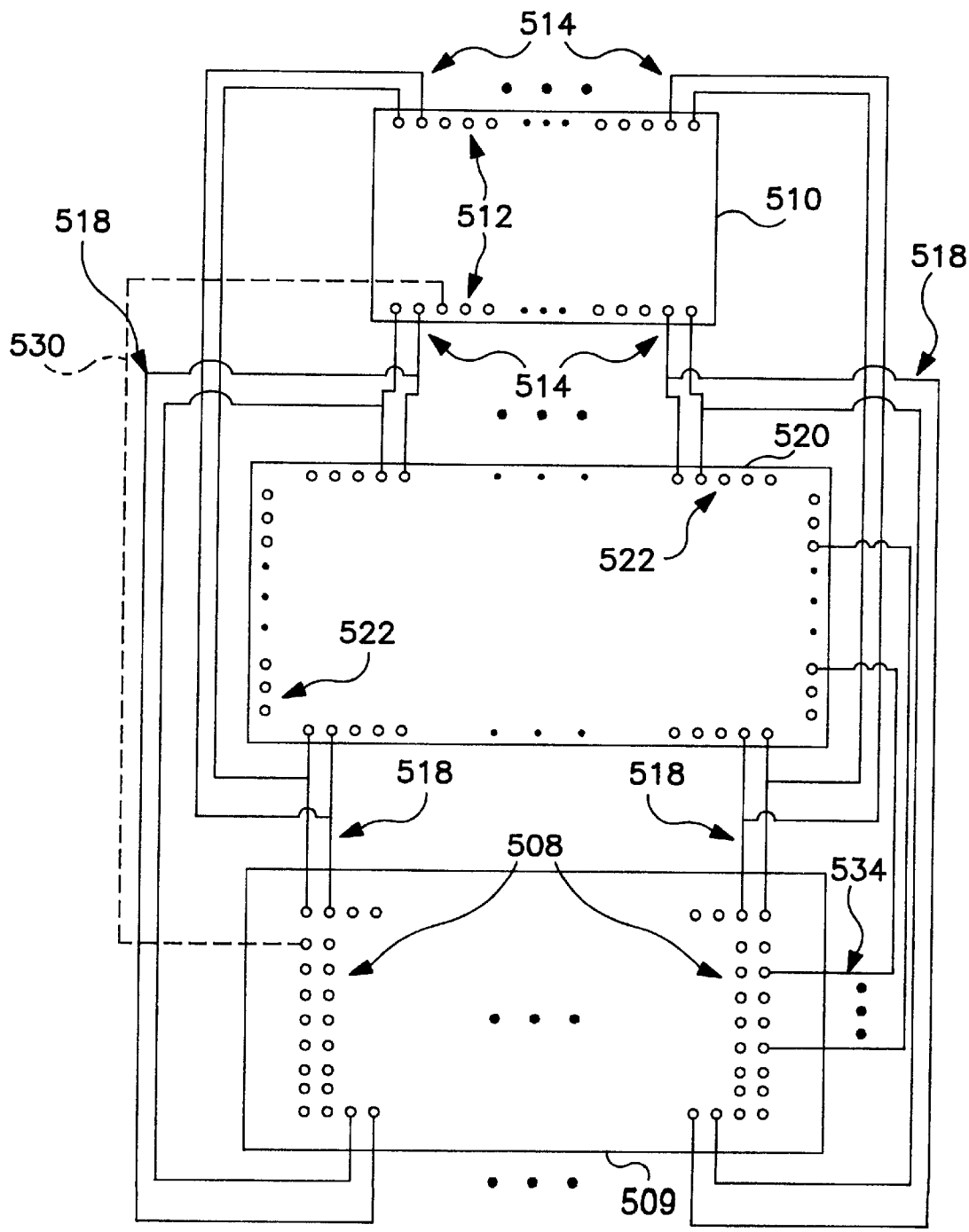
FIG. 14 is an illustrative block diagram showing electrical interconnection of a stacked microprocessor die and a memory die according to the present invention.

The semiconductor dice which can be stacked according to the present invention is not limited to any particular type of integrated circuit and/or any integrated circuit technology. Any dice with compatible interconnection density between them, i.e., compatible interconnection density between the first semiconductor die 52 and second semiconductor die 62, may be stacked according to the present invention. As used herein, compatible interconnection density refers to a useful plurality of interconnections between each die. For example, various combinations of different semiconductor die generally available from a variety of integrated circuit manufacturers may be used according to the present invention. Several possible combinations of semiconductor die include a microprocessor or a microcontroller die stacked with a memory die. Many of such processor and memory die have compatible interconnection in that memory die input/output is usefully connected to input/outputs of the processor. Further, such die being stacked need not be of equal size. For example, many of the processor die and memory die are of unequal size, e.g., the memory die is typically occupies a smaller planar area than the processor die. Stacking of different types of die having different sizes will be described further herein with reference to the stacking of a processor die and memory die as shown in FIGS. 13–14. Further, the die being stacked may be identical in nature as opposed to being of a different type or size. For example, and for which many useful applications are apparent, identical memory die may be stacked. Stacking of identical memory die shall be further described below with reference to the electrical connection diagram of FIG. 12.

The first mounting substrate 54 includes an upper surface 135 and a lower surface 137, first opposing edges 191, 192 as shown in FIG. 5, and second opposing edges 195, 197 as shown in FIGS. 9A and 9B. In the illustrative configuration of FIG. 5, only the opposing edges 191, 192 extend beyond the opposing edges 151, 153 of first semiconductor die 52. Although, as further described herein, all that is generally necessary is that at least two opposing edges of the first mounting substrate 54 extend past corresponding edges of the first semiconductor die 52, more than two edges of the first mounting substrate 54 may extend beyond corresponding edges of first semiconductor die 52 in an xy plane.

Figure 6A:
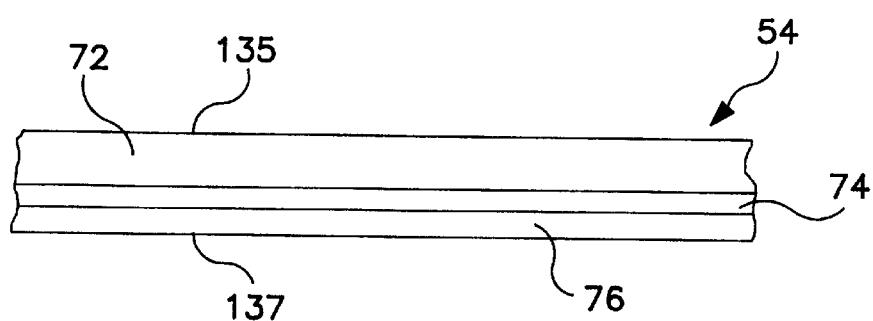
FIGS. 6A and 6B are illustrative diagrams showing the mounting substrates, e.g., tape, used in forming the semiconductor stacked device according to th, present invention as shown in FIG. 5.

The first mounting substrate 54 as shown in further detail in FIG. 6A is preferably a single metal layer die tape generally available or which can be manufactured as desired for a particular application by Shindo, Sheldahl, and Gould. As shown in FIG. 6A, the first mounting substrate 54 includes an insulative layer 72, e.g., a polyimide film or any other suitable insulative material, and a conductive layer 76 attached to the insulative layer 72 by an adhesive material 74. For example, the first mounting substrate 54 may be a single metal die tape such as a die tape including a polyimide film having an adhesive-backed copper foil attached thereto. The copper foil is patterned so as to form conductive traces for connection to die bond pads 92 of first semiconductor die 52. One skilled in the art will recognize that various materials are suitable for forming the single metal die tape.

A more detailed illustration of using the first mounting substrate 54 according to the present invention is shown in FIGS. 7A and 8. The conductive layer 76 of the first mounting substrate generally provides leads to the semiconductor die bond pads 92. For simplicity purposes, only one particular portion of the conductive material 76 is shown in FIGS. 7A and 8. As shown therein, the conductive material 76 includes a conductive trace 95 extending from a die bond pad 92 of first semiconductor die 52 and terminates in a conductive pad region 102 upon which a solder ball 56 is attached. The conductive trace 95 is shown as extending through a window 159 in the insulative and adhesive layer 72, 74 of the first mounting substrate 54 for electrical connection to the die bond pad 92. The window 159 is further illustrated in FIG. 9A.

Figure 7B:
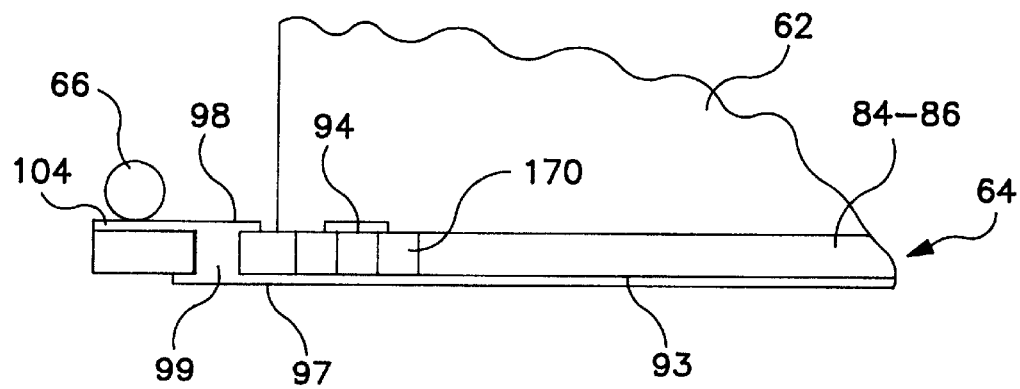
Figure 7C:
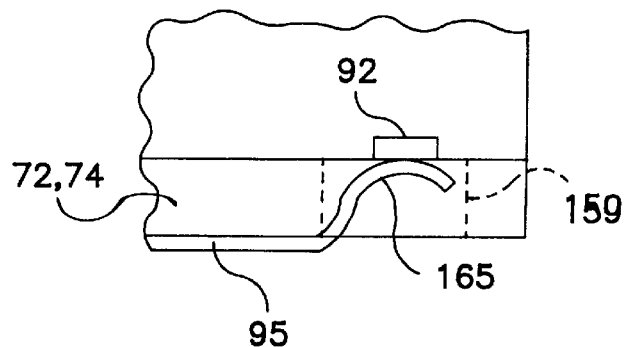

Yet further, a lead portion 165 of the conductive trace 95 is shown attached to the die bond pad 92 in FIG. 7C. FIG. 7C is a cross-section view of a portion of the structure shown in FIG. 7A at line 7C–7C. In assembly of the structure, the lead portions 165 are pushed through the windows 159 during TAB bonding after the first mounting substrate 54 is attached to the first semiconductor die 52. Such lead portions 165 are shown protruding upward from the unassembled mounting substrate 54 in FIG. 5. Further, conductive traces 96 as shown in FIGS. 7A and 9A provide electrical connection between other die bond pads 92 and solder balls 56 to other conductive pad regions 102. One skilled in the art will recognize that any generally flat substrate materials may be used for forming the first mounting substrate 54.

Upon provision of the first semiconductor die 52 and the first mounting substrate 54, the first mounting substrate 54, e.g., a single metal layer die tape, is attached to the semiconductor die using general tape automated bonding (TAB) processing. For example, TAB processing is used to position the first semiconductor die 52 adjacent a single metal layer die tape and lead portions 165 of the conductive layer 76 of the die tape are bonded to the die bond pads 92 of the first semiconductor die 52. Various TAB processes are known to those skilled in the art and various types of TAB processing may be used to accomplish such attachment of semiconductor die 52 to first mounting substrate 54. For example, upper surface 135 of the insulative layer 72, 74 includes an adhesive layer or coating for attachment of the first mounting substrate 54 to the first semiconductor die 52.

After attachment of first semiconductor die 52 to first mounting substrate 54, a plurality of solder balls 56 are attached to the conductive pad regions 102 on the lower surface 137 of the first mounting substrate 54. The solder balls 56 are preferably "standard" size eutectic solder balls. Such solder balls are commonly available from Alpha Materials and Senju Metal Industries. As used herein, a solder ball refers generally to substantially spherically shaped solder material. For example, such solder materials include eutectic Sn/Pb, high temperature 10/90 Sn/Pb, In/Sn, or any other alloys of commonly used elements such as tin (Sn), lead (Pb), silver (Ag), bismuth (Bi), indium (In), antimony (Sb), and cadmium (Cd). Various different solder materials and alloys may be used in the construction of the solder balls 56 attached to the first mounting substrate 54 and the solder balls 66 and 48 attached to the second mounting substrate 64. Preferably, the nominal diameter size of such balls is in the range of about 0.012 inches (0.30 mm) to 0.013 inches (0.33 mm), which fit common size conductive pad region pitches in the range of about 0.03 inches (0.75 mm) to about 0.02 inches (0.5 mm). A pad pitch refers to the distance between the centers of each pad and common sized pad pitches for chip scale packaging fall into the range of about 0.03 to about 0.02 inches. With the use of standard sized solder balls for stacking the semiconductor die, additional or separate connectors for stacking such die are not required according to the present invention. However, the structural configuration of the solder ball connections and the various positions of the semiconductor die and mounting substrates allow for only two semiconductor die to be stacked according to the present invention.

The solder balls 56 are attached to the conductive pad regions 102 by mechanical attachment and thermal reflow. It will be recognized to one skilled in the art that this process step and the various other processing steps of the present invention may be performed by batch processing or in-line processing and the present invention is not limited to any particular type of such processing to accomplish the assembly desired. Upon attachment of the solder balls 56, the subassembly 42 is completed and ready to be stacked on subassembly 44 to form semiconductor stacked device 38.

Figure 10A:
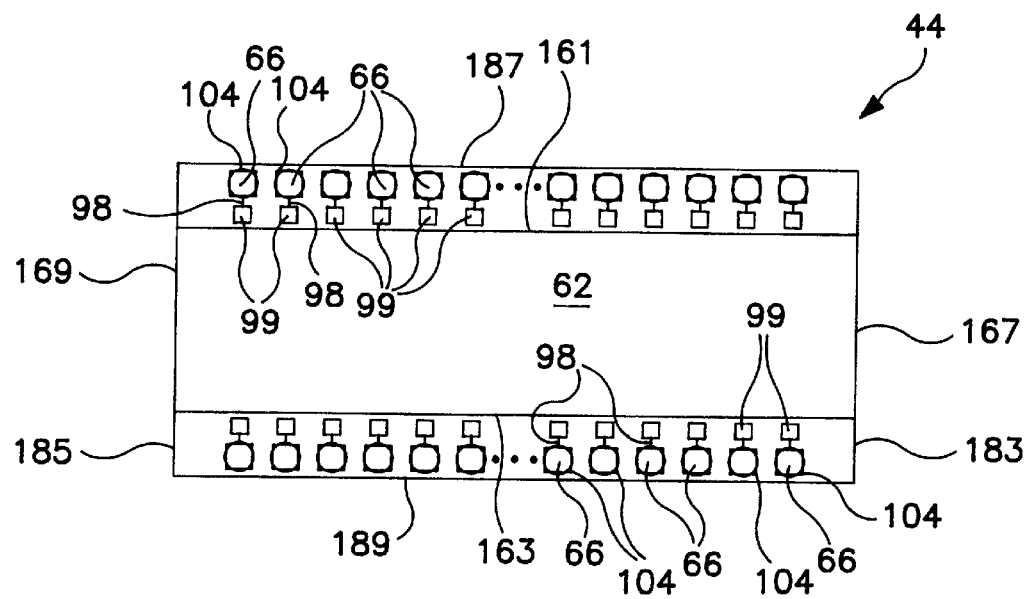
FIGS. 10A and 10B are top and bottom views, respectively, of another subassembly used in the method as shown in FIG. 5 including a second mounting substrate and semiconductor die attached thereto with solder balls attached at edge locations of the second mounting substrate and solder balls attached for external connection of the stacked device to a printed circuit board or some other assembly.
Figure 10B:
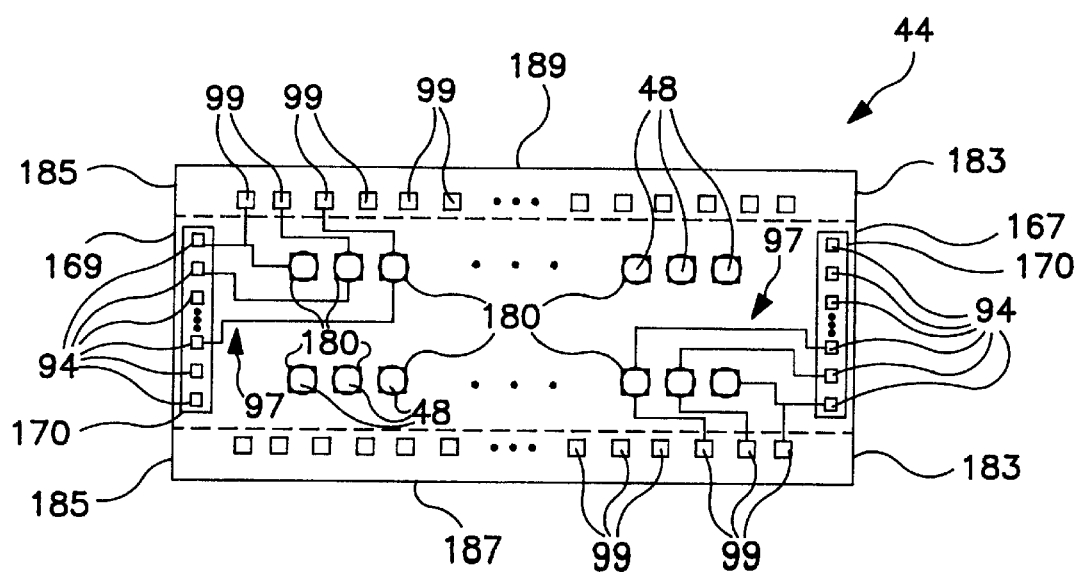

Subassembly 44 is generally formed of three components: second semiconductor die 62, second mounting substrate 64, and solder balls 66. As described above with reference to the first semiconductor die 52, the second semiconductor die 62 may be of any integrated circuit type and/or formed of any integrated circuit technology. Preferably, the die 62 is an identical die to semiconductor die 52, e.g., both dies being memory dies having the same die bond pad configuration, or the dice are a processor die and a memory die. The second semiconductor die 62 includes an upper surface 141 and a lower surface 143, first opposing edges 161, 163, and an additional pair of opposing edges 167, 169 as shown in FIGS. 10A and 10B. The semiconductor die 62 further includes a plurality of die bond pads 94 as shown in FIG. 10B located along two opposing edges of a primary face or side 143 of the die 62. One skilled in the art will recognize that the die bond pads are generally positioned along two opposing edges of the semiconductor die 62; however, the present invention is not limited to any particular configuration for the semiconductor die bond pads.

The second mounting substrate 64 includes an upper surface 145 and a lower surface 147, first opposing edges 187, 189 as shown in FIG. 5, and second opposing edges 183,185 as shown in FIGS. 10A and 10B. At least two opposing edges of the second mounting substrate 64 extend beyond corresponding edges of the second semiconductor die 62. For example, as shown in FIG. 5, opposing edges 187, 189 extend beyond edges 163, 161, respectively. The distance which such an edge 187, 189 extends beyond the edges 163, 161 of the semiconductor die is dependent at least in part on the size of the solder balls used for the substantially columnar solder connections 40. Preferably, the second mounting substrate 64 is a double metal layer die tape such as available or which can be manufactured as desired for a particular application by Shindo, Sheldahl, or Gould.

Figure 6B:
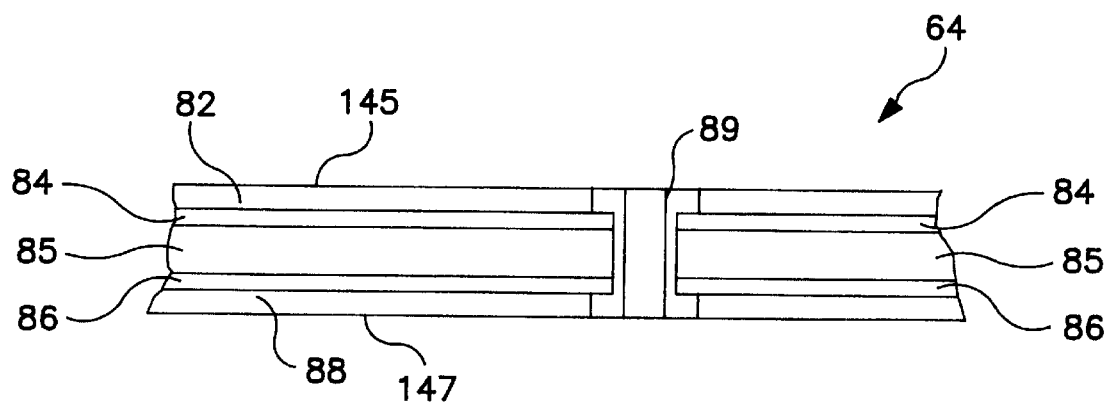

The second mounting substrate 64, as shown in more detail in FIG. 6B and which is shown attached to second semiconductor die 62 in FIG. 7B, generally includes an insulative material 85, e.g., a polyimide film or any other suitable insulative layer, and conductive material 82, 88 on respective sides of the generally flat and planar insulative layer 85. The conductive material 82, 88 is attached to the insulative material 85 via adhesive material 84, 86, respectively. The five layers of the second mounting substrate 64 can be drilled to form conductive vias 89 which are plated with a conductive material. The conductive vias 89 extend from the first conductive material 82 on the upper or first side 145 of the second mounting substrate 64 and extend through the second mounting substrate 64 to the second conductive material 88 at the opposite side 147 of the second mounting substrate 64. As used herein, conductive vias may refer to forms of interconnection other than plated drilled openings. For example, such connection from one side of the mounting substrate to the other side may be accomplished through the use of a filled opening, a lead extending through the substrate, or any other conductive material extending from one side of the substrate to the other side. Conductive vias as used herein shall refer to any form of electrical connection through a substrate from one side to the other side.

The second mounting substrate 64 may be formed of various materials like those used to form the first mounting substrate 54. For example, the second mounting substrate 64 may include a polyimide layer having adhesive coated copper on both sides thereof. The copper is patterned and the polyimide layer is drilled as required to form the desired configuration of conductive traces and vias. However, various materials may be used as would be recognized by one skilled in the art.

The single metal layer tape is sometimes referred to in the industry as a three layer tape and the two metal layer tape is sometimes referred to as a five layer tape. Such single and two metal layer die tape is commonly available in the industry, and is particularly useful in devices for high input/output die such as those available under the trade designation of μLBGA devices from Tessera, Inc.

The attachment of second semiconductor die 62 to the second mounting substrate 64 is shown in detail in FIGS. 7A and 8. The conductive material 82 on the upper or first side of the second mounting substrate 64 is patterned to form conductive traces 98 extending from vias 99 to conductive pad regions 104 proximate opposing edges 187, 189 of the second mounting substrate 64. Solder balls 66 are positioned upon such conductive pad regions 104. The conductive material 88 on the lower or second side 147 of the second mounting substrate 64 is patterned to form conductive traces 97 and other traces 93 extending from vias 99 such as for electrical connection to die bond pads 94 of the second semiconductor die 62 and/or external conductive pad regions 180 as more clearly shown in detail in FIG. 8. Such external conductive pad regions 180 as shown in FIGS. 8 and 10B are used for attachment of solder balls thereto for external connection of the stacked semiconductor device 38 to another assembly such as a printed circuit board, a hybrid device, etc. The lead portions of the conductive traces 97 are connected to the die bond pads 94 through windows 170 in the second mounting substrate 64 in the same manner as described for lead portions 165 with reference to FIG. 7C.

As described with respect to subassembly 42, the second semiconductor die 62 is attached to the second mounting substrate 64 preferably by TAB processing. Various TAB processes are known to those skilled in the art and various types of TAB processing may be used to accomplish such attachment of second semiconductor die 62 to second mounting substrate 64. For example, upper surface 145 of the insulative layer 84–86 includes an adhesive layer or coating for attachment of the mounting substrate to the die. Such processing being known to those skilled in the art will not be described in further detail herein.

The solder balls 66 attached to the conductive pad regions 104 of the second mounting substrate 64 are substantially identical to the solder balls 56 used in the formation of subassembly 42. Upon attachment of the solder balls 66 to the conductive pad regions 104 the subassembly, 44 is completed for use in stacking.

As further shown in FIG. 5, after completion of subassemblies 42 and 44, the subassemblies are positioned adjacent one another such that the second side 137 of first mounting substrate 54 is facing the upper surface 141 of second semiconductor die 62. In one particular embodiment herein as shown in FIG. 4 and FIG. 5, the second side 137 of first mounting substrate 54 and the upper side 141 of second semiconductor die 62 are separated by an adhesive material 46; however, such an adhesive layer is optional. When the first subassembly 42 and second subassembly 44 are stacked one upon the other, solder balls 56 of firs t subassembly 42 are in contact with corresponding solder ball s 66 of the second subassembly 44. Each of the solder balls 56 is in direct contact with a corresponding solder ball 66.

Upon stacking of the sol der balls 56, 66 upon one another, the two subassemblies 42, 44 a re in position for the solder balls to be reflowed. Upon reflowing of the solder, the first and second subassemblies, 42, 44, generally self-align to one another as the corresponding solder balls 56, 66 form the substantially columnar solder connection 40 as shown in further detail in FIG. 8. The reflow process is performed preferably by slowly ramping the temperature from room temperature to a higher temperature in the range of about 200° C. to about 215° C. followed by a slow ramp of the temperature back to a lower temperature, preferably, room temperature. Preferably, the higher temperature is about 210° C. The temperature will vary at least in part depending upon the type of solder used and the desired reflow of solder to be accomplished. Further, the solder balls generally self-align themselves on the appropriately sized conductive pad regions 102,104. As used herein, substantially columnar solder connection refers to any solder material configuration formed from the reflow of two or more stacked solder balls. The resultant shape of the substantially columnar solder connection may be as shown in FIG. 8, or may take the form of any structure which has a dimension that is greater than the largest diameter of a solder ball used to form the connection. It will be apparent that different sized solder balls may be used to form a single solder connection.

After the substantially columnar solder connections 40 are formed and the first subassembly 42 is stacked upon the second subassembly 44, additional solder balls 48 are attached to the external conductive pad regions 180. Once again, such solder balls are of a size suitable for external connection of the semiconductor stacked device 38 to another assembly, e.g., a printed circuit board. For example, such solder balls may be formed of the same solder materials as previously described herein and preferably of the same sizes as described herein; more preferably, the nominal diameter of the solder balls 48 are in the range of about 0.30 mm to about 0.33 mm.

One skilled in the art will recognize that preferably the external connections of the stacked device 38 are provided by solder balls for surface mounting to a printed circuit or other assembly such that chip scale packaging is achieved. However, other leads or conductive connection elements, such as gull wing leads, dual-in-line leads, or any other packaged product type leads could be used to provide the external connections of stacked device comprising the two stack semiconductor die.

The semiconductor stacked device 38 may be encapsulated with encapsulation material 41, such as commercially available silicone or epoxy to form an encapsulated stacked device 50, e.g., a ball grid array package, as shown in FIG. 5. Further, if these stacked packages are prepared in an array or strip form, e.g., multiple packages prepared simultaneously, there is a need to separate them either before or after testing, into individual packages.

FIG. 8 is a detailed perspective view of one portion of the semiconductor stacked device 38 showing the electrical connection path from a die bond pad 92 of first semiconductor die 52 to external conductive pad region 180. Further, the perspective view of FIG. 8 shows the electrical connection path from die bond pad 94 of the second semiconductor die 62 to the external conductive pad region 180. The electrical connection path from die bond pad 92 of the first semiconductor device 52 includes the conductive trace 95 from the die bond pad 92 to the conductive pad region 102. The conductive pad region 102 is then connected to the conductive pad region 104 of the second mounting substrate 64 by the substantially columnar solder connection 40. The conductive pad region 104 is electrically connected to the external conductive pad region 180 by way of conductive trace 98, via 99, and conductive trace 97. The electrical connection path from the die bond pad 94 of second semiconductor die 62 includes conductive trace 97 which extends from the die bond pad 94 to the external conductive pad region 180.

As shown in the illustrative diagram of FIG. 8, both die bond pads 92 and 94 are connected to the same external conductive pad region 180. However, if it is not desired that the die bond pad regions 92, 94 are both connected to the same external conductive pad region 180, then portions of the conductive paths can be eliminated. For example, in the case of the die bond pad being an input for chip select of one of two stacked memory die, the die bond pad 92 would require electrical connection to a separate external conductive pad region. Likewise, if die bond pad 94 was an input for chip select of one of two stacked memory die, it too would require a separate conductive path to an external conductive pad region 180. By way of illustration, if die bond pad region 92 was a chip select input for a memory die, the portion 181 of the conductive trace 97 extending to the conductive bond pad 94 would not be required. Likewise, if die bond pad 94 was a chip select for a memory die, then the connection from via 99 to conductive pad region 180 would not be present; only a trace extending from the die bond pad 94 to external pad region 180 is needed.

FIG. 9A shows a bottom view of subassembly 42 including illustrative conductive traces 96 for connecting die bond pads 92 to appropriate conductive pad regions 102 of the first mounting substrate 54 upon which solder balls 56 are attached. FIG. 9B shows a top view of the subassembly 42.

FIG. 10A shows a top view of subassembly 44 including illustrative conductive traces 98 connecting conductive pad regions 104 on the upper surface 145 of the second mounting substrate 64 to vias 99. FIG. 10B shows a bottom view of subassembly 44 which illustratively shows the conductive traces 97 for connecting the die bond pads 94 of second semiconductor die 62 to the external conductive pad regions 180. Further, the conductive traces 97 connect the vias 99 to the external conductive pad regions 180. Yet, further shown in FIG. 10B are solder balls 48 for use in externally connecting the stacked device 38 to an appropriate assembly, such as a printed circuit board.

As shown in FIGS. 9 and 10, the conductive pad regions 102 on the lower surface 137 of the first mounting substrate 54 and the conductive pad regions 104 on the upper surface 145 of the second mounting substrate 64 are located proximate opposing edges 191, 192 and opposing edges 187, 189, respectively. Generally, many memory die have die bond pads on only two sides, i.e., along two edges thereof much like that shown in FIGS. 9A and 10B. By having the conductive pad regions 102 and 104 with the suitable solder balls 56, 66, respectively, positioned proximate to and along sides opposite of the die bond pads, redistribution of the balls along such sides of the mounting substrates in any scheme or configuration can be accomplished. For example, in FIGS. 9A and 10A, the solder balls 56 and 66 are correspondingly distributed in substantially a straight line between edge 195 to edge 197 and between edge 183 and edge 185, respectively. It will be recognized that each of the solder balls 56 have a corresponding solder ball 66 positioned for contact therewith. The solder balls are positioned only on one side of the tape of each of the two mounting substrates having die attached thereto. This stacking technique limits the number of stacked die to two.

Figure 11A:
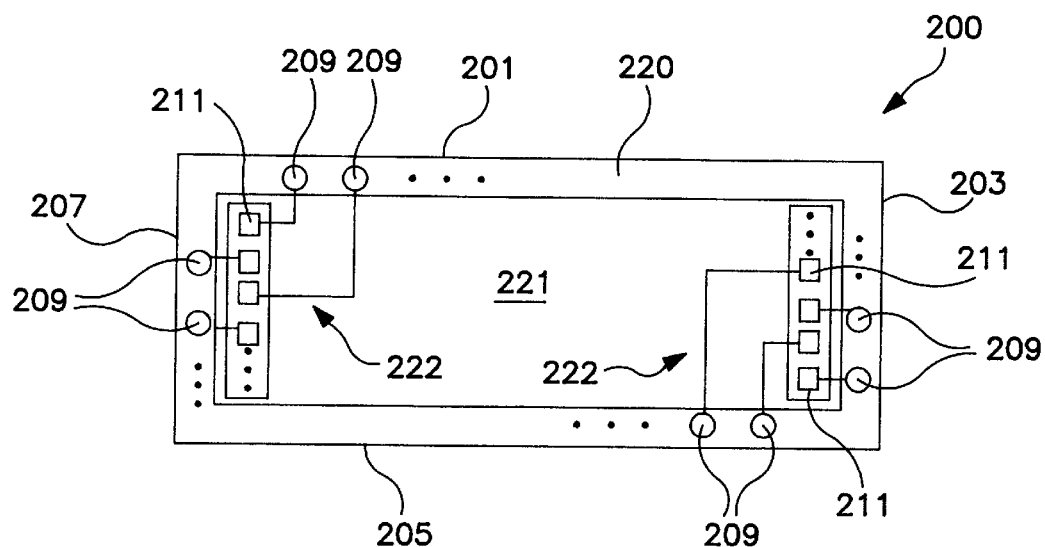
FIGS. 11A and 11B show alternate placement locations for solder ball attachment to form solder ball connections according to the present invention.

One skilled in the art will recognize that the solder balls may be positioned in various other configurations. For example, as shown in FIG. 11A, the solder balls may be positioned proximate more than two edges of the mounting substrates. An assembly 200 is shown in FIG. 11A which includes solder balls 209 along all four edges 201, 203, 205, and 207 of the mounting substrate 220. The solder balls 209 are connected to die bond pads 211 of semiconductor die 221 via conductive traces 222. Note that the pitch between conductive pad regions in such a configuration is greatly increased.

Figure 11B:
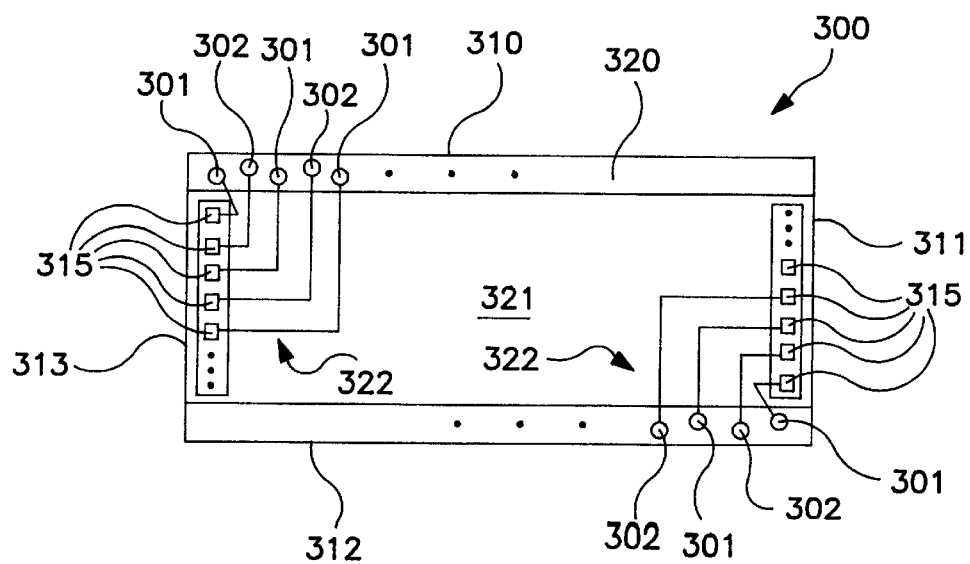

Further, as shown in FIG. 11B, the solder balls may be staggered proximate two or more edges of the mounting substrate. For example, as shown in the structure 300 of FIG. 11B, mounting substrate 320 for attaching a die 321 thereto includes edges 310–313. Solder balls are positioned proximate the two edges 310 and 312 of the mounting substrate 320. The solder balls 301 are positioned at a distance further from the edge 310 than solder balls 302. Likewise, solder balls 301 are positioned at a distance further away from the edge 312 than solder balls 302. In such a manner, the distance between such balls may be increased so that higher number of inputs/outputs can be facilitated. The solder balls 301 and 302 are connected to die bond pads 315 of the semiconductor die 321 by conductive traces 322.

Figure 12:
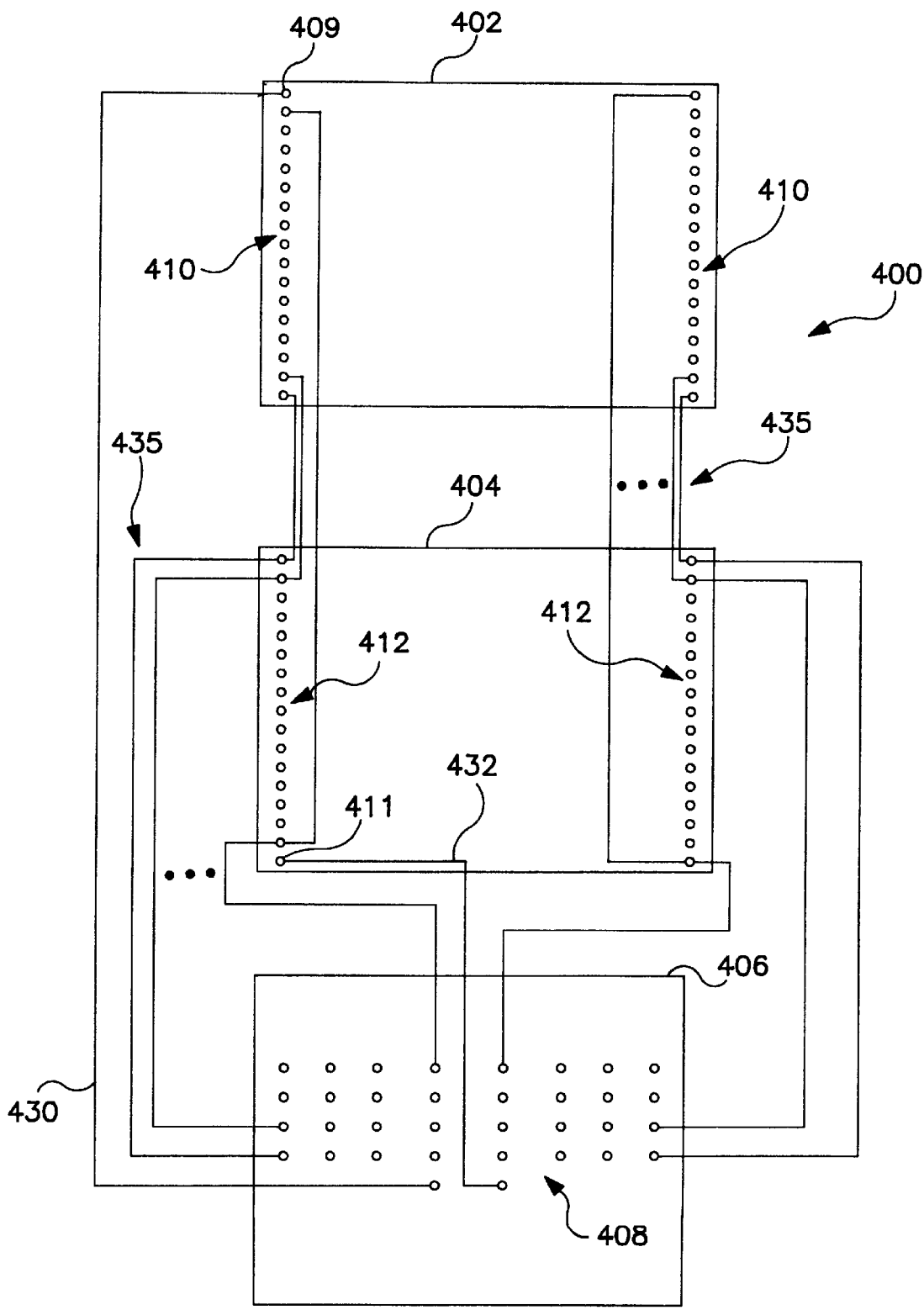
FIG. 12 is an illustrative block diagram showing electrical interconnection of two stacked memory dice according to the present invention.

FIG. 12 shows one illustrative embodiment of the electrical connection accomplished in the stacking of two memory dice according to the present invention. The use of chip select addressing is preferred for such memory dice because it adds only one input/output per die (i.e., die bond pad) that needs to be routed to the external conductive bond pads at the lower surface of the second mounting substrate. FIG. 12 includes a first semiconductor die 402, a second semiconductor die 404, and a block 406 including or representative of external conductive pads and solder ball connections 408. The semiconductor devices 402 and 404 may be any memory die. However, in this particular example the memory die are memory die with thirty-four (34) input/output die bond pads, e.g., Sony SRAM (128K× 8). As shown in FIG. 12, the memory die 402 includes die bond pads 410 and the memory die 404 includes die bond pads 412. Each of the memory die includes a chip select input/output. The chip select input/output for memory die 402 is represented by die bond pad 409 and the chip select input/output for memory die 404 is represented by die bond pad 411.

As illustrated in FIG. 12, the chip select die bond pad 409 of memory die 402 is routed as previously described herein through the solder ball connection and vias to the bottom traces of the second mounting substrate for connection to its own separate corresponding external conductive pad 408. Likewise, chip select die bond pad 411 is routed by conductive trace on the bottom side of the second mounting substrate to its own separate corresponding external conductive pad 408. Each of the die bond pads 410 and a corresponding die bond pad 412 of the respective memory die 402, 404 are routed to a respective corresponding external conductive pad region 408 as shown generally in FIG. 12 by conductive traces 435.

Generally, such memory die which have not been subject to backlapping have a thickness of about 20 to 22 mil. In such a case, 13 mil solder balls are used so as to provide clearance for a memory die between the first mounting substrate and the second mounting substrate. The total thickness of the semiconductor stacked device is then generally in the range of about 60 to 70 mil. With the use of a two solder ball connection, die which has not been backlapped is possible.

One skilled in the art will recognize that the thicknesses of the dies and other components of the semiconductor stacked device may vary. Accordingly, appropriately sized solder balls for accomplishing stacking according to the present invention are selectable. For example, if the die being stacked is 30 to 32 mil, two solder balls having a total diameter of greater than 32 mil is required to stack the die. Further, it will be recognized that one of the die may have a different thickness than the other. In such a case, it may be preferable to use the thicker die as the first semiconductor die which is stacked upon the second semiconductor die.

FIG. 13 generally shows a perspective view of a configuration of a portion of a semiconductor stacked device 505 according to the present invention which is representative of a stack of two different sized dice, e.g., a processor die and a memory die. Although these two die could be any die having compatible interconnection, for simplicity, and also preferably, FIG. 13 shall be described wherein die 510 is a memory die and die 520 is a processor die. Such die as previously described herein have compatible interconnection.

The semiconductor stacked device 505 includes a first mounting substrate 540, e.g., a single metal die tape used in tape automated bonding (TAB) processes, having memory die 510 attached thereto. Further, the semiconductor stacked device 505 includes a second mounting substrate 550, e.g., a double metal layer die tape used in TAB processes, having a processor die 520 attached thereto. The memory die 510 and processor die 520 are stacked in the vertical direction (i.e., along the z axis) using substantially columnar solder connections 511. The substantially columnar solder connections 511 as previously described herein are formed from solder balls attached respectively to both the first mounting substrate 540 and second mounting substrate 550. The stacked device 505 includes solder balls 545 attached to the lower side of the second mounting substrate for external connection to another assembly, e.g., a printed circuit board.

FIG. 14 shows one illustrative block diagram showing electrical interconnection of a stacked microprocessor die 510 and memory die 520 of a stacked device 505 according to the present invention. It is preferred that a significant number of inputs/outputs of the memory die 510 be routed from the memory die 510 to the processor die 520 before being routed for connection to a substrate such as a printed circuit board through external conductive bond pads at the lower surface of the second mounting substrate 550. FIG. 14 shows memory die 510, processor die 520, and a block 509 including or representative of external connection elements such as conductive pads and solder ball connections 545. Although the die 510 and 520 may be any memory die and processor die having compatible interconnection, in this particular example, the memory die is a memory die with thirty-eight (38) input/output die bond pads, e.g., Enable SRAM (128K×8) and the processor is a 114 input/output die bond pad processor die. As shown in FIG. 14, the memory die 510 includes die bond pads 512 and the processor die 520 includes die bond pads 522. Each of the memory die and processor die includes a ground and power connection along with various other input/outputs.

As illustrated in FIG. 14, the die bond pads 512 of memory die 510 and corresponding die bond pads 522 of processor die 520 are routed as previously described herein to a respective corresponding external conductive pad region 508 as shown generally in FIG. 14 by lines 514 and 518. In a preferred configuration, all of the die bond pads (i.e., inputs/outputs including ground and power) are routed in such a manner. However, as is optionally shown in FIG. 14 by dashed line 530, one or more die bond pads 512 of memory die 510, e.g., ground, power, or any of the other inputs/outputs of memory die 519, may be routed as previously described herein through the solder ball connections and vias to the bottom traces of the second mounting substrate for connection to their own separate corresponding external conductive pad 508, i.e., separate in that die bond pads 522 from processor die 520 are not connected to such external conductive pads 508. Further, as there are more inputs/outputs for the processor die 520 than for the memory die, one or more die bond pads 522 of processor die 520 are routed as previously described herein by conductive traces on the bottom side of the second mounting substrate to its own separate corresponding external conductive pad 508, i.e., separate in that die bond pads 512 from memory die 510 are not connected to such external conductive pads 508. Such conductive traces are generally shown in FIG. 14 by lines 534.

One skilled in the art will recognize that the overall size of the stacked device 505 will be determined primarily on the size of the larger die, e.g., processor die 520 in the device 505. The overall area occupied will be just slightly larger than the die 520 in that the mounting substrates used generally has at least two edges which extend past the edges of the processor die 520 to accommodate stacking by solder ball connections 511.

Further, it will be recognized that generally the size of the one die may vary greatly relative to the size of the other die. The smaller die will generally be positioned above the larger die with the mounting substrate providing the necessary conductive traces for routing and connection of the die bond pads of the smaller die to the edges of the mounting substrate for connection through the solder ball connections 511 along at least two sides 547, 549 of the stacked device 505. Generally, although it is mechanically advantageous to use mounting substrates that have at least two edges which extend past the edges of the die being stacked, e.g., solder columns along at least two sides of the stack of dice, it may only be required that such solder columns for electrically connecting the top die to the bottom die and through the external connections be along one side of the stacked dice. For example, particularly when the top die is a smaller die, e.g., memory die 510 or even a smaller die such as represented by dashed line die 513, the die 513 may be connected to the lower die, e.g., the processor die 520, by an adhesive material for mechanical strength. In such a case, electrical connection of the stacked die may be accomplished by routing the traces to a single set of solder columns at side 547 as opposed to both the sides 547 and 549.

Yet further, as shown in FIG. 13, it is not necessary that the mounting substrates 540, 550 be of the same overall size, e.g., mounting substrate 540 occupies a smaller area than mounting substrate 550. Such sized configurations for the mounting substrates are at least in part selected to minimize the amount of material used while attaining the desired electrical connections.

The preceding specific embodiments are illustrative of the practice of the invention. It is to be understood, therefore, that other expedients known to those skilled in the art or disclosed herein may be employed without departing from the invention or the scope of the appended claims. For example, the present invention is not limited to the use of solder balls along only two edges of the mounting substrate, but such solder balls may be positioned along more than two and may even be staggered in configuration. Further, any type of semiconductor die may be stacked according to the present invention wherein the die has compatible interconnection density. The present invention is also not limited to use in connection with medical apparatus, but may find further application in other relevant areas such as portable electronic devices. The present invention further includes within its scope methods of making and using the semiconductor stacked device according to the present invention. As such, the present invention further includes within its scope other methods of making and using the invention described herein above.

What is claimed is:

1. A method for stacking semiconductor die, the method comprising:

providing a first semiconductor die including a plurality of first die bond pads;

providing a first mounting substrate including a first side and a second side, wherein the first mounting substrate includes one or more first conductive traces for electrical connection to one or more of the plurality of first die bond pads, wherein one or more of the first conductive traces terminate at conductive pad regions at the second side of the first mounting substrate, wherein the first semiconductor die is adjacent the first side of the first mounting substrate;

providing a second semiconductor die including a plurality of second die bond pads;

providing a second mounting substrate including a first side and a second side, wherein the second mounting substrate includes one or more conductive vias therethrough, one or more conductive traces on a first side of the second mounting substrate for electrical connection to the conductive vias, and one or more conductive traces on the second side of the second mounting substrate for electrical connection to one or more of the plurality of second die bond pads, and wherein one or more of the conductive traces on the first side of the second mounting substrate terminate at conductive pad regions, wherein the second semiconductor die is adjacent the first side of the second mounting substrate; attaching a plurality of solder balls to a plurality of the conductive pad regions on the second side of the first mounting substrate;

attaching a plurality of solder balls to a plurality of the conductive pad regions on the first side of the second mounting substrate; and forming a plurality of substantially columnar solder connections, each columnar solder connection formed from a solder ball attached to a conductive pad region on the second side of the first mounting substrate and a corresponding solder ball attached to a conductive pad region on the first side of the second mounting substrate.

2. The method of claim 1, wherein the method further comprises positioning an adhesive between the second side of the first mounting substrate and the second semiconductor die.

3. The method of claim 2, wherein the conductive pad regions on the first side of the second mounting substrate are proximate at least one edge of the second mounting substrate, and further wherein the conductive pad regions on the second side of the first mounting substrate are proximate at least one edge of the first mounting substrate.

4. The method of claim 1, wherein each of one or more of the conductive traces on the second side of the second mounting substrate extend between one of the conductive vias and one of the die bond pads of the second semiconductor die, extend between a die bond pad of the second semiconductor die and an external conductive pad region on the second side of the second mounting substrate, and extend between a conductive via and the external conductive pad region on the second side of the second mounting substrate.

5. The method of claim 1, wherein the conductive pad regions on the first side of the second mounting substrate are proximate at least two opposing edges of the second mounting substrate, and further wherein the conductive pad regions on the second side of the first mounting substrate are proximate at least two opposing edges of the first mounting substrate.

6. The method of claim 5, wherein at least three edges of the first mounting substrate have conductive pad regions at the second side of the first mounting substrate proximate thereto, and further wherein at least three edges of the second mounting substrate have conductive regions at the first side of the second mounting substrate proximate thereto.

7. The method of claim 5, wherein the conductive pad regions of the first mounting substrate are proximate to and staggered along at least two opposing edges on the second side of the first mounting substrate with alternating conductive pad regions being closer to the edge than the other conductive pad regions, and further wherein the conductive pad regions of the second mounting substrate are proximate to and staggered along at least two opposing edges at the first side of the second mounting substrate with alternating conductive pad regions being closer to the edge than the other conductive pad regions.

8. The method of claim 1, wherein forming of the plurality of substantially columnar solder connections includes positioning the first mounting substrate with respect to the second mounting substrate such that the plurality of solder balls attached to conductive pad regions on the second side of the first mounting substrate are in contact with the plurality of corresponding solder balls attached to conductive pad regions on the first side of the second mounting substrate, and further wherein forming of the plurality of substantially columnar solder connections includes reflowing the solder balls.

9. The method of claim 1, wherein the method includes creating at least one conductive path from one of the die bond pads of each of the memory die to a separate corresponding external conductive pad region at the second side of the second mounting substrate.

10. A method of forming a semiconductor stacked device, the method comprising:

providing a single metal layer die tape having a first semiconductor die attached thereto;

providing a double metal layer die tape having a second semiconductor die attached thereto;

attaching a plurality of solder balls to a plurality of conductive pad regions of the single metal layer die tape, one or more of the conductive pad regions electrically connected to one or more die bond pads of the first semiconductor die, attaching a plurality of solder balls to a plurality of conductive pad regions of the double metal layer die tape; and forming a plurality of substantially columnar solder connections, each columnar solder connection formed from a solder ball attached to a conductive pad region of the single metal die tape and a corresponding solder ball attached to a conductive pad region of the double metal layer die tape, wherein after formation of the substantially columnar solder connections the second semiconductor die is positioned between the single metal layer die tape and the double metal layer die tape.

11. The method of claim 10, wherein the single metal layer die tape includes one or more conductive traces on one side of the single metal layer die tape for electrical connection to one or more of a plurality of first die bond pads of the first semiconductor die, wherein the double metal layer die tape includes one or more conductive vias therethrough, one or more conductive traces on a first side of the double metal layer die tape for use in electrically connecting the single metal layer die tape to the double metal layer die tape, and one or more conductive traces on a second side of the double metal layer die tape for electrical connection to one or more of a plurality of second die bond pads of the second semiconductor die, and further wherein the solder balls are used to electrically connect the conductive traces on the one side of the single metal layer die tape to the conductive traces on the first side of the double metal layer die tape.

12. The method of claim 11, wherein the conductive pad regions of the double metal layer die tape are proximate at least two opposing edges of the double metal layer die tape, and further wherein the conductive pad regions of the single metal layer die tape are proximate at least two opposing edges of the sing le metal layer die tape.

13. The method of claim 11, wherein each of on e or more of the conductive traces on the second side of the double metal layer die tape extend between one of the conductive vias and one of the die bond pads of the second semiconductor die, extend between a die bond pad of the second semiconductor die and an external conductive pad region on the second side of the double metal layer die tape, and extend between a conductive via and the external conductive pad region on the second side of the double metal layer die tape.

14. The method of claim 10, wherein the forming of a plurality of substantially columnar solder connections includes positioning the single metal layer die tape with respect to the double metal layer die tape such that a plurality of solder balls attached to conductive pad regions of the single metal layer die tape are in contact with a plurality of corresponding solder balls attached to conductive pad regions of the double metal layer die tape and reflowing the solder balls.

15. A method of forming a stacked memory device, the method comprising:

providing a first memory die including a plurality of first die bond pads;

providing a first mounting substrate including one or more conductive traces on one side of the first mounting substrate for electrical connection to one or more of the plurality of first die bond pads;

providing a second memory die including a plurality of second die bond pads;

providing a second mounting substrate including one or more conductive vias therethrough, one or more conductive traces on a first side of the second mounting substrate for use in electrically connecting the first mounting substrate to the second mounting substrate, and one or more conductive traces on a second side of the second mounting substrate for electrical connection to one or more of the plurality of second die bond pads;

attaching a plurality of solder balls to a plurality of conductive pad regions of the conductive traces on the one side of the first mounting substrate, one or more of the conductive pad regions electrically connected to one or more die bond pads of the first memory die;

attaching a plurality of solder balls to a plurality of conductive pad regions of the conductive traces on the first side of the second mounting substrate; and forming a plurality of substantially columnar solder connections, each columnar solder connection formed from a solder ball attached to a conductive pad region of the first mounting substrate and a corresponding solder ball attached to a conductive pad region of the second mounting substrate, wherein the second memory die is located between the first mounting substrate and the second mounting substrate.

16. The method of claim 15, wherein the conductive pad regions on the first side of the second mounting substrate are proximate at least two opposing edges of the second mounting substrate, and further wherein the conductive pad regions on the one side of the first mounting substrate are proximate at least two opposing edges of the first mounting substrate.

17. The method of claim 16, wherein each of one or more of the conductive traces on the second side of the second mounting substrate extend between one of the conductive vias and one of the die bond pads of the second semiconductor die, extend between a die bond pad of the second semiconductor die and an external conductive pad region on the second side of the second mounting substrate, and extend from a conductive via and the external conductive pad region on the second side of the second mounting substrate.

18. The method of claim 15, wherein forming of a plurality of substantially columnar solder connections includes positioning the first mounting substrate with respect to the second mounting substrate such that a plurality of solder balls attached to conductive pad regions on the one side of the first mounting substrate are in contact with a plurality of corresponding solder balls attached to conductive pad regions on the first side of the second mounting substrate of a plurality of substantially columnar solder connections, and further wherein forming of a plurality of substantially columnar solder connections includes reflowing the solder balls.

19. The method of claim 15, wherein the method includes creating at least one conductive path from one of the die bond pads of each of the first memory die and second memory die to a separate corresponding external conductive pad region at the second side of the second mounting substrate.

20. A method of forming a stacked device, the method comprising:

providing a memory die including a plurality of first die bond pads;

providing a first mounting substrate including one or more conductive traces on one side of the first mounting substrate for electrical connection to one or more of the plurality of first die bond pads;

providing a processor die including a plurality of second die bond pads;

providing a second mounting substrate including one or more conductive vias therethrough, one or more conductive traces on a first side of the second mounting substrate for use in electrically connecting the first mounting substrate to the second mounting substrate, and one or more conductive traces on a second side of the second mounting substrate for electrical connection to one or more of the plurality of second die bond pads;

attaching a plurality of solder balls to a plurality of conductive pad regions of the conductive traces on the one side of the first mounting substrate, one or more of the conductive pad regions electrically connected to one or more die bond pads of the memory die;

attaching a plurality of solder balls to a plurality of conductive pad regions of the conductive traces on the first side of the second mounting substrate; and forming a plurality of substantially columnar solder connections, each columnar solder connection formed from a solder ball attached to a conductive pad region of the first mounting substrate and a corresponding solder ball attached to a conductive pad region of the second mounting substrate, wherein the processor die is located between the first mounting substrate and the second mounting substrate.

21. The method of claim 20, wherein the conductive pad regions on the first side of the second mounting substrate are proximate at least two opposing edges of the second mounting substrate, and further wherein the conductive pad regions on the one side of the first mounting substrate are proximate at least two opposing edges of the first mounting substrate.

22. The method of claim 21, wherein each of one or more of the conductive traces on the second side of the second mounting substrate extend between one of the conductive vias and one of the die bond pads of the second semiconductor die, extend between a die bond pad of the second semiconductor die and an external conductive pad region on the second side of the second mounting substrate, and extend from a conductive via and the external conductive pad region on the second side of the second mounting substrate.

23. The method of claim 20, wherein forming of a plurality of substantially columnar solder connections includes positioning the first mounting substrate with respect to the second mounting substrate such that a plurality of solder balls attached to conductive pad regions on the one side of the first mounting substrate are in contact with a plurality of corresponding solder balls attached to conductive pad regions on the first side of the second mounting substrate of a plurality of substantially columnar solder connections, and further wherein forming of a plurality of substantially columnar solder connections includes reflowing the solder balls.

* * * * *